United States Patent
Tsutsui

(10) Patent No.: US 10,457,049 B2
(45) Date of Patent: Oct. 29, 2019

(54) METHOD FOR MANUFACTURING LIQUID EJECTION HEAD AND LIQUID EJECTION HEAD

(71) Applicant: CANON KABUSHIKI KAISHA, Tokyo (JP)

(72) Inventor: Satoshi Tsutsui, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/900,503

(22) Filed: Feb. 20, 2018

(65) Prior Publication Data

US 2018/0244043 A1 Aug. 30, 2018

(30) Foreign Application Priority Data

Feb. 24, 2017 (JP) .................................. 2017-033912

(51) Int. Cl.

| | |
|---|---|
| *B41J 2/16* | (2006.01) |
| *B41J 2/14* | (2006.01) |
| *G03F 7/16* | (2006.01) |
| *G03F 7/32* | (2006.01) |
| *G03F 7/36* | (2006.01) |
| *G03F 7/038* | (2006.01) |
| *G03F 7/11* | (2006.01) |
| *G03F 7/38* | (2006.01) |

(52) U.S. Cl.
CPC .......... *B41J 2/1631* (2013.01); *B41J 2/1433* (2013.01); *B41J 2/162* (2013.01); *B41J 2/1603* (2013.01); *B41J 2/1628* (2013.01); *B41J 2/1629* (2013.01); *B41J 2/1639* (2013.01); *B41J 2/1642* (2013.01); *B41J 2/1645* (2013.01); *B41J 2/1646* (2013.01); *G03F 7/038* (2013.01); *G03F 7/11* (2013.01); *G03F 7/167* (2013.01); *G03F 7/32* (2013.01); *G03F 7/325* (2013.01); *G03F 7/36* (2013.01); *G03F 7/38* (2013.01); *B41J 2202/22* (2013.01)

(58) Field of Classification Search
None
See application file for complete search history.

(56) References Cited

U.S. PATENT DOCUMENTS

| 8,152,276 B2 * | 4/2012 | Murayama ........... B41J 2/14024 347/47 |
| 8,221,177 B2 * | 7/2012 | Iwakura .............. H01L 27/3246 445/24 |

FOREIGN PATENT DOCUMENTS

JP 2009001003 A 1/2009

\* cited by examiner

*Primary Examiner* — Alejandro Valencia
(74) *Attorney, Agent, or Firm* — Canon U.S.A., Inc. IP Division

(57) ABSTRACT

A method for manufacturing a liquid ejection head includes selectively exposing a first photosensitive resin layer to light, thereby curing the portion of the first photosensitive resin layer defining a flow channel member; forming a second photosensitive resin layer on the first photosensitive resin layer; selectively exposing the second photosensitive resin layer to light, thereby curing the portion of the second photosensitive resin layer defining an ejection opening member; and removing the unexposed portions of the first and the second photosensitive resin layer at one time with a developer. Before removal with the developer, the water absorption W of the intermediate layer, the water absorption W1 of the exposed portion of the first photosensitive resin layer, and the water absorption W2 of the exposed portion of the second photosensitive resin layer satisfy the relationship $W \geq W1 > W2$.

5 Claims, 5 Drawing Sheets ated by the same reference numerals in the drawings, and thus description thereof is omitted.

METHOD FOR MANUFACTURING LIQUID EJECTION HEAD AND LIQUID EJECTION HEAD

BACKGROUND

Field of the Disclosure

The present disclosure relates to a method for manufacturing a liquid ejection head and to a liquid ejection head.

Description of the Related Art

A liquid ejection head is used as, for example, an ink jet recording head in an ink jet recording apparatus for ejecting ink. The liquid ejection head typically has ejection openings through which vary small droplets of a liquid are ejected, liquid flow channels communicating with the ejection openings, and energy generating elements each disposed in a portion of the respective flow channels and adapted to generate energy for ejecting the liquid.

Japanese Patent Laid-Open No. 2009-1003 discloses a method for manufacturing such a liquid ejection head. In this method, first, a photosensitive resin layer is formed on a substrate and is then selectively exposed to cure the portions acting as walls defining the liquid flow channels. Subsequently, another photosensitive resin layer is formed over the previously formed photosensitive resin layer and is then selectively exposed to cure the portion other than the ejection openings. Then, the two photosensitive resin layers are developed with a developer to remove the unexposed portions, thus forming the flow channels and ejection openings.

SUMMARY

According to an aspect of the present disclosure, there is provided a method for manufacturing a liquid ejection head including a substrate, a flow channel member overlying the substrate and defining a flow channel through which a liquid flows, an ejection opening member overlying the flow channel member and defining an ejection opening through which the liquid is ejected, and an intermediate layer between the substrate and the flow channel member. The method include forming the intermediate layer over the substrate, forming a first photosensitive resin layer over the intermediate layer, selectively exposing the first photosensitive resin layer to light, thereby curing the portion of the first photosensitive resin layer defining the flow channel member, forming a second photosensitive resin layer over the first photosensitive resin layer; selectively exposing the second photosensitive resin layer to light, thereby curing the portion of the second photosensitive resin layer defining the ejection opening member; and removing the unexposed portions of the first and the second photosensitive resin layer at one time with a developer. Before the removal with the developer, the water absorption W of the intermediate layer, the water absorption W1 of the exposed portion of the first photosensitive resin layer, and the water absorption W2 of the exposed portion of the second photosensitive resin layer satisfy the relationship W≥W1>W2.

According to another aspect of the present disclosure, a liquid ejection head is provided which includes a substrate, a flow channel member overlying the substrate and defining a flow channel through which a liquid flows, an ejection opening member overlying the flow channel member and defining an ejection opening through which the liquid is ejected, and an intermediate layer between the substrate and the flow channel member. In this liquid ejection head, the water absorption W of the intermediate layer, the water absorption W1 of the flow channel member, and the water absorption W2 of the ejection opening member satisfy the relationship W≥W1>W2.

Further features of the present disclosure will become apparent from the following description of exemplary embodiments with reference to the attached drawings.

DESCRIPTION OF THE EMBODIMENTS

Figure 1A:
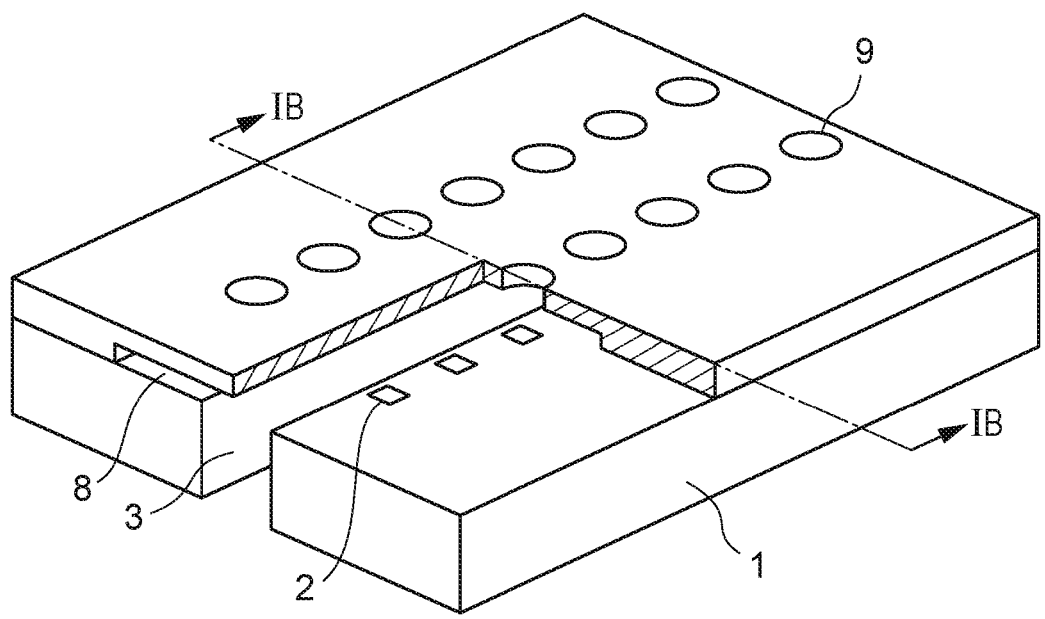
FIG. 1A is a schematic perspective view of a liquid ejection head according to an embodiment of the present disclosure.

In the liquid ejection head manufacturing method disclosed in Japanese Patent Laid-Open No. 2009-1003, the exposed photosensitive resin layers are simultaneously developed to remove the unexposed portions at one time, but not developed one after another. Accordingly, the development takes a long time. Long-time development allows the developer to dissolve the resin of the unexposed portions, but can cause the developer to penetrate the exposed portions and form wrinkle-like lines (hereinafter referred to as solvent cracks) in the surface of the resulting liquid ejection head. If solvent cracks are grown around the ejection openings in the surface of the liquid ejection head, the liquid is not precisely ejected.

Accordingly, the present disclosure provides a method for manufacturing a liquid ejection head enabling solvent cracks to be reduced. The present disclosure also provides a liquid ejection head having few solvent cracks and capable of precisely ejecting a light.

Exemplary embodiments of the disclosure will now be described with reference to the drawings. In the following description, same parts having the same function are designated by the same reference numerals in the drawings, and thus description thereof is omitted.

Figure 1B:
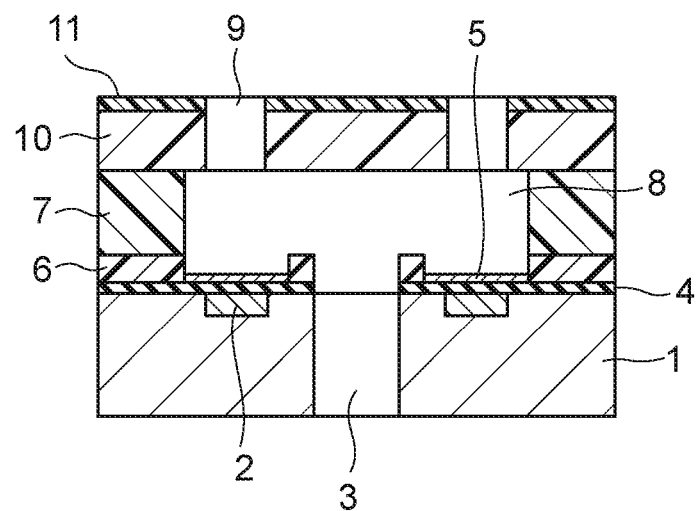
FIG. 1B is a schematic sectional view taken along line IB-IB in FIG. 1A.

FIG. 1A is a schematic perspective view of a liquid ejection head, and FIG. 1B is a schematic sectional view of the liquid ejection head taken along line IB-IB in FIG. 1A and showing a section perpendicular to the surface of the substrate.

The liquid ejection head shown in FIGS. 1A and 1B includes a substrate 1 including energy generating elements 2 configured to generate an energy used for ejecting a liquid. The energy generating elements are arranged at regular intervals. The substrate 1 may be made of silicon and, more specifically, may be a monocrystalline silicon substrate whose surface has a (100) crystal orientation. The energy generating element 2 may be an electrothermal conversion element or a piezoelectric element. A control signal input electrode (not shown) is connected to the energy generating elements 2 for operating the energy generating elements 2. The substrate 1 has an ink supply port 3 through which an ink is supplied. A flow channel member 7 defining flow channels 8 is disposed over the substrate 1 with an intermediate layer 6 therebetween. The intermediate layer 6 enhances the adhesion between the substrate 1 and the flow channel member 7 and protects a circuit formed at the surface of the substrate 1. An ejection opening member 10 is disposed over the flow channel member 7. The ejection opening member 10 has through holes therein acting as ejection openings 9. In the liquid ejection head, the ink fed into the flow channels 8 through the supply port 3 is ejected as ink droplets through the ejection openings 9 by applying a pressure generated by the energy generating elements 2 to the liquid. The energy generating elements 2 may be arranged such that the ink fed through the supply port 3 flows under the energy generating elements 2. This arrangement may be made by etching the substrate 1 around the energy generating elements 2.

An inorganic material layer 4 and a protective layer 5 may be disposed over the substrate 1. The inorganic material layer 4 may function as an insulating layer. If the energy generating elements 2 are electrothermal conversion elements, the inorganic material layer 4 may function as a heat accumulation layer. The inorganic material layer 4 covers the substrate 1 and the energy generating elements 2. The inorganic material layer 4 may be made of silicon dioxide ($SiO_2$), silicon nitride (SiN), silicon carbide (SiC), or silicon carbonitride (SiCN). The protective layer 5 protects the energy generating elements 2 and may be made of, for example Ta. The protective layer 5 is disposed on the inorganic material layer 4 at least corresponding to the energy generating elements 2.

Also, a liquid-repellent layer 11 may optionally be disposed over the ejection opening member 10.

A method for manufacturing the liquid ejection head will now be described.

FIGS. 2A to 2K are schematic sectional views illustrating a method for manufacturing a liquid ejection head, according to an embodiment of the present disclosure and show the section at the same position as the sectional view of the finished form shown in FIG. 1B.

Figure 2A:
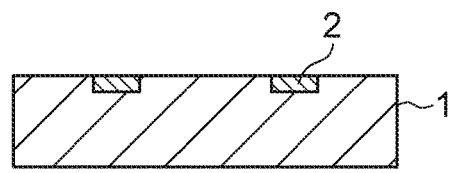
FIGS. 2A to 2K are schematic representations illustrating a method for manufacturing a liquid ejection head according to an embodiment of the present disclosure.

First, a substrate 1 provided with energy generating elements 2 at the front surface thereof is prepared as shown in FIG. 2A.

Figure 2B:
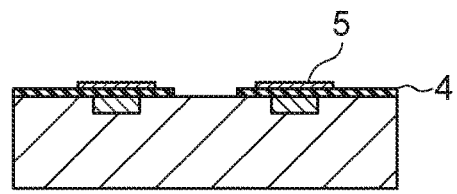

Then, an inorganic material layer 4 is formed on the front surface of the substrate 1 so as to cover the energy generating elements 2, as shown in FIG. 2B. Also, a protective layer 5 is formed over the energy generating elements 2. The inorganic material layer 4 and the protective layer 5 are patterned as required.

Figure 2C:
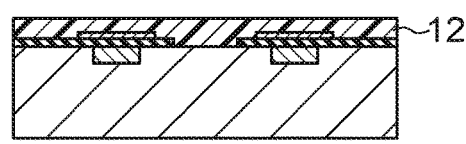

Subsequently, a resin layer 12, which is to be act as an intermediate layer 6, is formed over the inorganic material layer 4, as shown in FIG. 2C. Since the liquid ejection head has a fine structure, the resin layer 12 will be subjected to highly precise patterning. Accordingly, it is beneficial to form the resin layer 12 of a photosensitive resin composition for photolithography. The resin composition for forming the resin layer 12 may be a cationically polymerizable epoxy resin composition in view of reliable adhesion to the flow channel member 7, which will be described herein below, and stability to the liquid to be ejected. However, any resin composition may be used for the resin layer 12 as long as the resin can enhance the adhesion and has a protective role, and the intermediate layer 6 is not necessarily formed by photolithography. Beneficial resin compositions for the resin layer 12 will be described herein later. The resin layer 12 may be formed by coating, such as spin coating. The thicknesses of the resin layer 12 is appropriately determined according to the ejection design of the liquid ejection head. Typically, the thickness of the resin layer 12 is smaller than the first photosensitive resin layer 14 and the second photosensitive resin layer 16 and may be, for example, in the range of 0.5 μm to 5.0 μm.

Figure 2D:
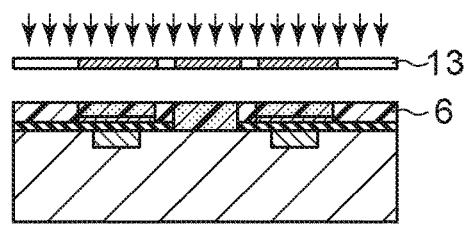

Then, the resin layer 12 is selectively exposed to light through a mask 13 (intermediate layer-forming mask) having an intermediate layer pattern, as shown in FIG. 2D, thus being formed into the intermediate layer 6 having a desired shape. If the resin layer 12 is formed of a negative photosensitive resin, the portion of the resin layer 12 exposed to light is cured. The resin layer 12 may be subjected to heat treatment (post exposure bake). The intermediate layer-forming mask 13 may include a substrate capable of transmitting exposure light, such as a glass or quartz substrate, and chromium light-shield films formed corresponding to portions not exposed to light, such as the regions of the resin layer 12 over the energy generating elements 2. The exposure apparatus used in this step may be a projection exposure apparatus using a single wavelength light source, such as i-line exposure stepper or a KrF stepper, or a projection exposure apparatus using a light source having a broad wavelength range of a mercury lamp, such as Mask Aligner MPA-600 Super (manufactured by Canon). An i-line exposure stepper is advantageous because of its high precision and high illuminance.

Figure 2E:
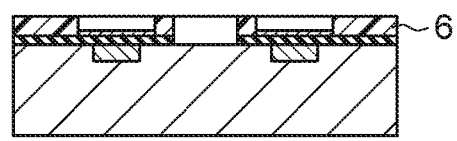

Next, as shown in FIG. 2E, the unexposed portion of the resin layer 12 is removed with a developer to yield the intermediate layer 6. The developer may be an organic solvent selected from the group consisting of propylene glycol monomethyl ether acetate (PGMEA), propylene glycol monomethyl ether (PGME), methyl isobutyl ketone (MIBK), diglyme, isopropyl alcohol (IPA), tetramethylammonium hydroxide (TMAH), n-butyl acetate, and xylene or a mixture of these organic solvents, such as PGMEA and PGME, MIBK and xylene, or MIBK and PGMEA. The intermediate layer 6 may be subjected to rinsing with IPA or to post-bake, if necessary.

Figure 2F:
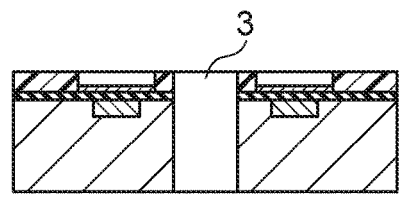

Then, a supply port 3 passing through the substrate is formed, as shown in FIG. 2F. Ink will be supplied to the supply port 3. More specifically, the supply port 3 is formed in a predetermined position in the substrate 1 by wet etching using an alkaline etchant, such as tetramethylammonium hydroxide (TMAH), or dry etching, such as reactive ion etching. The supply port 3 may be formed after forming a flow channel member 7 and an ejection opening member 10, which will be described herein below.

Figure 2G:
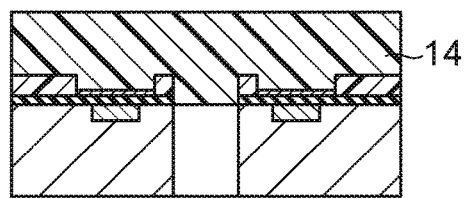

Subsequently, a first photosensitive resin layer 14 is formed over the intermediate layer 6 (and resin layer 12), as shown in FIG. 2G. The first photosensitive resin layer 14 will be formed into a flow channel member 7. In the formation of the first photosensitive resin layer 14, a photosensitive resin composition may be applied to a PET or polyimide film base and then transferred onto the intermediate layer 6. The photosensitive resin composition for forming the first photosensitive resin layer 14 may be a cationically polymerizable epoxy resin composition in view of adhesion to the intermediate layer 6 and an ejection opening member 10 described herein later, mechanical strength, stability to the liquid to be ejected, and resolution. The thicknesses of the first photosensitive resin layer 14 is appropriately determined according to the ejection design of the liquid ejection head and may be in the range of 3 μm to 25 μm.

Figure 2H:
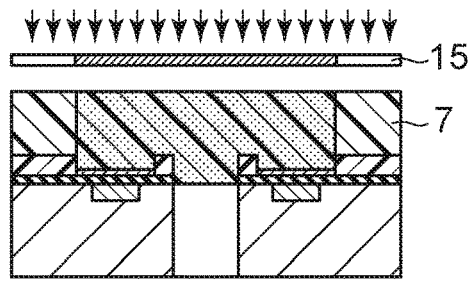

Subsequently, the first photosensitive resin layer 14 is selectively exposed to light through a flow channel-forming mask 15 having a flow channel pattern to cure the portion thereof defining the flow channel member 7, as shown in FIG. 2H, thus being formed into the flow channel member 7. The first photosensitive resin layer 14 may further be subjected to heat treatment (post exposure bake). The flow channel-forming mask 15 may include a substrate capable of transmitting exposure light, such as a glass or quartz substrate, and chromium light-shield films formed corresponding to the flow channel pattern. The exposure apparatus used in this step may be a projection exposure apparatus using a single wavelength light source, such as i-line exposure stepper or a KrF stepper, or a projection exposure apparatus using a light source having a broad wavelength range of a mercury lamp, such as Mask Aligner MPA-600 Super (manufactured by Canon). An i-line exposure stepper is advantageous because of its high precision and high illuminance.

Figure 2I:
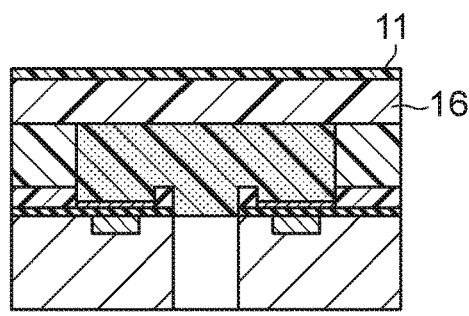

Next, as shown in FIG. 2I, a second photosensitive resin layer 16 and, optionally, a liquid-repellent layer 11 are formed over the first photosensitive resin layer 14, as shown in FIG. 2G. The second photosensitive resin layer 16 will be formed into an ejection opening member 10. In the formation of the second photosensitive resin layer 16, a photosensitive resin composition may be applied to a PET or polyimide film base and then transferred onto the first photosensitive resin layer 14. The photosensitive resin composition for forming the second photosensitive resin layer 16 may be a cationically polymerizable epoxy resin composition in view of adhesion to the flow channel member 7, mechanical strength, stability to the liquid to be ejected, and resolution. The thicknesses of the second photosensitive resin layer 16 is appropriately determined according to the ejection design of the liquid ejection head and may be in the range of 3 µm to 25 µm in view of mechanical strength. The second photosensitive resin layer 16 is provided with a liquid-repellent layer 11 thereon. The liquid-repellent layer 11 may be formed by spin coating or lamination performed in the same manner as the case of the second photosensitive resin layer 16. The liquid-repellent layer 11, which is required to be repellent to liquid, may be formed of a resin composition containing a compound having a fluorine-containing group, particularly a perfluoroalkyl group or a perfluoropolyether group. In general, the fluorine-containing group of a compound having a fluorine-containing group is segregated to the interface between the liquid-repellent layer 11 and air by heat treatment after the application of the compound, thus imparting high liquid repellency to the surface. If the compound having a fluorine-containing group further has a cationically polymerizable group, the compound reacts with the resin in the second photosensitive resin layer 16 to bind firmly with the resin.

Figure 2J:
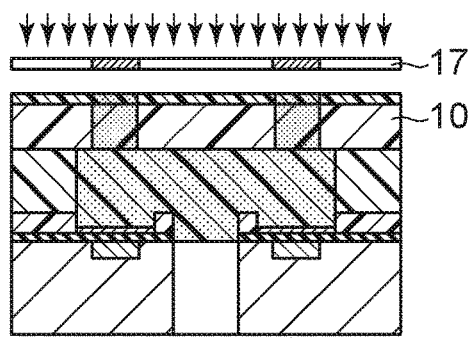

Then, the second photosensitive resin layer 16 is selectively exposed to light through an ejection opening-forming mask 17 having an ejection opening pattern to cure the portion thereof defining the ejection opening member 10, as shown in FIG. 2J, thus being formed into the ejection opening member 10. The liquid-repellent layer 11, if provided, is simultaneously cured. The second photosensitive resin layer 16 may further be subjected to heat treatment (post exposure bake). The ejection opening-forming mask 17 may include a substrate capable of transmitting exposure light, such as a glass or quartz substrate, and chromium light-shield films formed corresponding to the flow channel pattern. The exposure apparatus used in this step may be a projection exposure apparatus using a single wavelength light source, such as i-line exposure stepper or a KrF stepper, or a projection exposure apparatus using a light source having a broad wavelength range of a mercury lamp, such as Mask Aligner MPA-600 Super (manufactured by Canon). An i-line exposure stepper is advantageous because of its high precision and high illuminance.

If the first photosensitive resin layer 14 and the second photosensitive resin layer 16 are exposed to light having the same wavelength, the second photosensitive resin layer 16 must be more sensitive than the first photosensitive resin layer 14. If not, the portion of the first photosensitive resin layer 14 intended not to be exposed is cured by the light that has passed through the second photosensitive resin layer 16 when the second photosensitive resin layer 16 has been exposed to light.

Figure 2K:
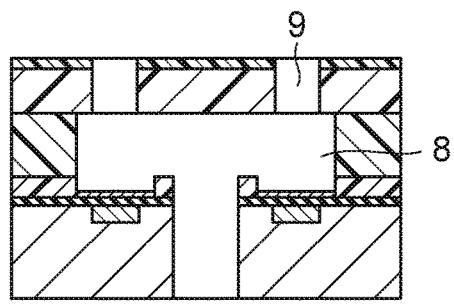

Then, as shown in FIG. 2K, the first and the second photosensitive resin layers 14 and 16 are developed at one time to remove the unexposed portions thereof with a developer, thus forming the flow channels 8 and ejection openings 9. The liquid-repellent layer 11, if provided, is simultaneously developed. The structure thus formed may be subjected to rinsing with IPA or heat treatment, if necessary. The developer may be an organic solvent selected from the group consisting of propylene glycol monomethyl ether acetate (PGMEA), propylene glycol monomethyl ether (PGME), methyl isobutyl ketone (MIBK), diglyme, isopropyl alcohol (IPA), tetramethylammonium hydroxide (TMAH), n-butyl acetate, and xylene or a mixture of these organic solvents, such as PGMEA and PGME, MIBK and xylene, or MIBK and PGMEA.

Although in the method of the present embodiment, the second photosensitive resin layer 16 is formed on the first photosensitive resin layer 14 after the exposure of the first photosensitive resin layer 14, the second photosensitive resin layer 16 may be formed before the exposure of the first photosensitive resin layer 14. Also, the intermediate layer 6, the flow channel member 7, and the ejection opening member 10 may each have a multilayer structure. The liquid-repellent layer 11 is optional and is not necessarily formed. FIGS. 3A to 3K are representations illustrating a process in the case where the liquid-repellent layer 11 is not formed. This process is performed in the same manner as the process shown in FIGS. 2A to 2K, except that the liquid-repellent layer 11 is not formed after the second photosensitive resin layer 16 has been formed.

The resin layers used in the liquid ejection head of the present embodiment will now be described.

The resin compositions for forming the intermediate layer 6, the first photosensitive resin layer 14, or the second photosensitive resin layer 16 each may be a cationically polymerizable epoxy resin composition in view of the adhesion, mechanical strength and liquid (ink) resistance of the cured product of the resin composition. Beneficially, the epoxy resin composition is a photo-cationically polymerizable epoxy resin composition containing an epoxy resin and a photopolymerization initiator.

Examples of the epoxy resin include bisphenol A epoxy resin, bisphenol F epoxy resin, phenol novolac epoxy resin, cresol novolac epoxy resin, and multifunctional epoxy resin having an oxycyclohexane skeleton. The use of a multifunctional epoxy resin enables the cured product to have three-dimensional crosslinks and helps impart desired properties to the cured product. The epoxy resin is commercially available, and examples thereof include Celloxide 2021, GT-300 series, GT-400 series, and EHPE 3150 (each produced by Daicel); jER 1031S, jER 1004, jER 1007, jER 1009, jER 1010, jER 1256, and 157S70 (each produced by Mitsubishi Chemical Corporation); EPICLON N-695, EPICLON N-865, EPICLON 4050, and EPICLON 7050 (each produced by DIC Corporation); TECHMORE VG 3101 and EPOX-MKR 1710 (each produced by Printec); Denacol series (produced by Nagase Chemtex); and EP-4000S and EP-4010S (each produced by ADEKA). A mixture of two or more of these epoxy resins may be used.

The photopolymerization initiator may be selected from among sulfonic acid compounds, diazomethane compounds, sulfonium salts, iodonium salts, and disulfone-based compounds. A photo-acid generator may be used as the photopolymerization initiator. The photopolymerization initiator is commercially available, and examples thereof include ADEKA Optomer SP-170, ADEKA Optomer SP-172, and ADEKA Optomer SP-150 (each produced by ADEKA); BBI-103 and BBI-102 (each produced by Midori Kagaku); IBPF, IBCF, TS-01, and TS-91 (each produced by Sanwa Chemical); CPI-210, CPI-300, and CPI-410 (each produced by San-Apro); and Irgacure 290 (produced by BASF). A mixture of two or more of these photopolymerization initiators may be used.

Each resin composition may contain a polyol or a silane coupling agent for further enhancing the adhesion. The silane coupling agent is commercially available, and, for example, A-187 produced by Momentive Performance Materials may be used.

For increasing pattern resolution or controlling sensitivity, the resin composition may further contain any of the following additives: a sensitizer, such as anthracene compound; an amine or any other basic substance; an acid generator capable of producing weakly acidic (pKa=−1.5 to 3.0) toluenesulfonic acid. The acid generator may be TPS-1000 produced by Midori Kagaku or WPAG-367 produced by Wako Pure Chemical Industries.

Commercially available negative photoresists may be used as the resin compositions, and examples thereof include SU-8 series and KMPR-1000 (each produced by Kayaku MicroChem); and TMMR S2000 and TMMF S2000 (each produced by Tokyo Ohka Kogyo).

In the present embodiment, the water absorption W of the resin layer 6, the water absorption W1 of the exposed portion of the first photosensitive resin layer 14, and the water absorption of the exposed portion of the second photosensitive resin layer 16 satisfy the relationship W≥W1>W2. The water absorption used herein refer to that before removal with a developer. By thus controlling the water absorptions, solvent cracks that may occur in the surface of the ejection opening member 10 can be reduced, achieving a highly precise liquid ejection head.

Solvent cracks are considered to be wrinkle-like lines that are caused by the developer. The developer, in the step of removing the unexposed portion, reaches the exposed portion and swells the second photosensitive resin layer 16, and then causes the resin to contract when being dried. If solvent cracks are formed around the ejection openings 9, the shape of the ejection openings 9 is changed. This makes precise ejection of the liquid ejection head difficult. In the liquid ejection head manufacturing method that has described above, the exposed photosensitive resin layers are simultaneously developed to remove the unexposed portions at one time, but not remove one after another. Accordingly, the development takes a long time. The development time in this method may be in the range of 5 minutes to 90 minutes. Long-time development allows the developer to dissolve the resin of the unexposed portions, but can cause the developer to penetrate the exposed portions. Consequently, the second photosensitive resin layer 16 is likely to swell, resulting in solvent cracks.

When the water absorption W1 of the exposed portion of the first photosensitive resin layer 14 and the water absorption W2 of the exposed portion of the second photosensitive resin layer 16 satisfy the relationship W1>W2, the first photosensitive resin layer 14 is more permeable to the developer than the second photosensitive resin layer 16. Accordingly, the developer that has penetrated the second photosensitive resin layer 16 flows into the first photosensitive resin layer 14, thus hindered from swelling the second photosensitive resin layer 16. However, since the second photosensitive resin layer 16 adjoins to the first photosensitive resin layer 14, a large swelling of the first photosensitive resin layer 14 causes the second photosensitive resin layer 16 to expand. Solvent cracks may not be sufficiently reduced. It is therefore not beneficial the first photosensitive resin layer 14 is excessively swelled. If the water absorption W1 of the exposed portion of the first photosensitive resin layer 14 is higher than the water absorption W of the intermediate layer 6 formed under the first photosensitive resin layer 14, the developer that has penetrated the intermediate layer 6 flows into the first photosensitive resin layer 14 as well. It is therefore beneficial for hindering the developer from flowing into the first photosensitive resin layer 14 from the intermediate layer 6 that the water absorptions W and W1 satisfy the relationship W≥W1. By controlling the water absorptions W, W1, and W2 before the removal with the developer so as to satisfy the relationship W≥W1>W2, the second photosensitive resin layer 16 can be hindered from swelling, so that solvent cracks in the ejection opening member 10 can be reduced.

The water absorption of each resin layer can be controlled as desired by appropriately determining the constituents and the proportions thereof in the resin composition of the resin layer, appropriately selecting process conditions, such as exposure dose and heat treatment temperature, and adjusting the crosslink density of the resin layer before the removal with the developer. If the resin composition is a cationically polymerizable epoxy resin composition, the crosslink density of the resin layer can be controlled by adjusting the epoxy equivalent weight of the resin and the proportion of the photopolymerization initiator.

According to some examinations by the present inventors, it is beneficial that the water absorption W1 of the exposed portion of the first photosensitive resin layer 14 is twice to five times as high as the water absorption W2 of the exposed portion of the second photosensitive resin layer 16. When water absorption W1 is at least twice as high as water absorption W2, solvent cracks can be further reduced. From the viewpoint of hindering the first photosensitive resin layer 14 from swelling excessively, water absorption W1 may be 5 times or less, beneficially 3 times or less, as high as water absorption W2. Also, the water absorption W of the intermediate layer 6 is higher than the water absorption W1 of the exposed portion of the first photosensitive resin layer 14; hence the relationship W>W1 holds true. In the case of satisfying W>W1, the developer flows into the intermediate layer 6 from the first photosensitive resin layer 14, consequently being hindered from swelling the second photosensitive resin layer 16. The upper limit of water absorption W may be, but is not limited to, twice or less as high as water absorption W1. When water absorption W is twice or less as high as water absorption W1, the intermediate layer 6 can be hindered from swelling excessively and have good adhesion to the substrate 1 or the inorganic material layer 4.

The water absorption of the resin layers can be determined as below. A coating of the resin composition for a resin layer to be examined is formed on a silicon substrate and subsequently cured by exposure and optional heat-treated. The cured product of the resin composition is immersed in pure water for 24 hours, and the change in mass per volume of the cured product from the cured product before immersion is measured. Water absorption is a measure of the density of a cured resin. The higher the water absorption of a resin, the higher the density of the resin. It can therefore be assumed that a cured product having a higher water absorption, or a lower crosslink density, is more permeable to the developer even though the developer is not water. For immersing a resin layer in water for measuring the water absorption of the resin, the water may be heated to a temperature higher than room temperature. Water absorption mentioned herein is the value of a resin measured when immersed in water of 70° C. The water absorption W2 of the exposed portion of the second photosensitive resin layer 16 when immersed in water of 70° C. for 24 hours may be in the range of 0.05% to 0.3%, beneficially in the range of 0.1% to 0.2%. The water absorption W1 of the exposed portion of the first photosensitive resin layer 14 when measured under the same conditions may be in the range of 0.3% to 0.6%, beneficially in the range of 0.4% to 0.6%. The water absorption W of the intermediate layer 6 when measured under the same conditions may be in the range of 0.3% to 0.7%, beneficially in the range of 0.4% to 0.6%.

The thickness of the first photosensitive resin layer 14 may be 0.8 time to 3.0 times, beneficially 1 time to 2.8 times, as large as that of the second photosensitive resin layer 16. When the thickness of the first photosensitive resin layer 14 is 0.8 time or more as large as the thickness of the second photosensitive resin layer 16, the developer that has penetrated the second photosensitive resin layer 16 flows more easily into the first photosensitive resin layer 14, thus being further hindered from swelling the second photosensitive resin layer 16. Also, when the thickness of the first photosensitive resin layer 14 is 3.0 time or less as large as the thickness of the second photosensitive resin layer 16, the first photosensitive resin layer 14 is unlikely to swell excessively, and, accordingly, solvent cracks are further reduced.

EXAMPLES

Examples of the present disclosure, which are not intended to limit the disclosure, will now be described.

Example 1

A liquid ejection head was prepared through the steps shown in FIGS. 3A to 3K.

Figure 3A:
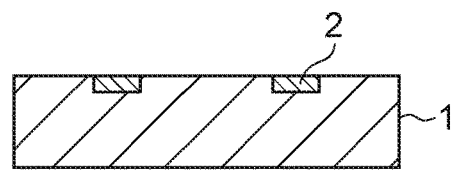
FIGS. 3A to 3K are schematic representations illustrating a method for manufacturing a liquid ejection head according to another embodiment of the present disclosure.

First, a silicon substrate 1 provided with TaSiN energy generating elements 2 at the front surface thereof was prepared as shown in FIG. 3A.

Figure 3B:
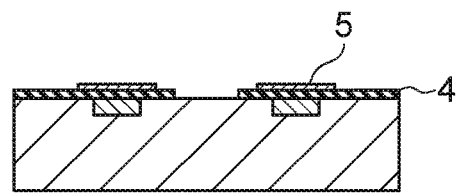

Then, as shown in FIG. 3B, a SiCN inorganic material layer 4 was formed to a thickness of 1.0 μm by CVD on the front surface of the substrate 1 so as to cover the energy generating elements 2. Subsequently, Ta for a protective layer 5 was deposited to a thickness of 0.25 μm by sputtering. The inorganic material layer 4 and the protective layer 5 were further subjected to patterning by photolithography and reactive etching.

Figure 3C:
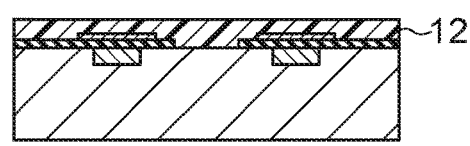

Then, the photosensitive resin composition shown in Table 1 was applied over the inorganic material layer 4 and the protective layer 5 by spin coating, as shown in FIG. 3C. The coating of the photosensitive resin composition was heated at 90° C. for 5 minutes to remove the solvent to yield a 1.0 μm-thick resin layer 12.

TABLE 1

| | Product name | Parts by mass |
|---|---|---|
| Epoxy resin | TEHCMORE VG 3101 | 100 |
| Photo-acid generator | SP-172 | 6 |
| Silane coupling agent | A-187 | 5 |
| Solvent | PGMEA | 100 |

Figure 3D:
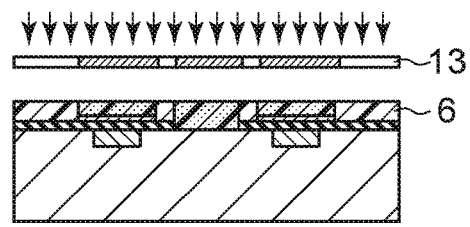

The resin layer was exposed to light at an exposure dose of 4000 J/m² through an intermediate layer-forming mask 13 with an i-line exposure stepper i5 (manufactured by Canon), as shown in FIG. 3D, and was then heated at 90° C. for 5 minutes to cure the exposed portion to form an intermediate layer 6.

Figure 3E:
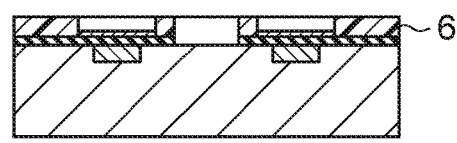

The unexposed portion of the resin layer 12 was removed with PGMEA (propylene glycol monomethyl ether acetate) for 3 minutes, thus patterning the intermediate layer 6, as shown in FIG. 3E.

Figure 3F:
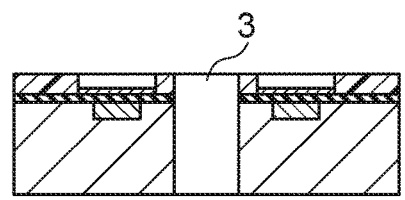

Then, a supply port 3 was formed as shown in FIG. 3F. More specifically, an etching mask having an opening was formed of a positive photosensitive resin OFPR (manufactured by Tokyo Ohka Kogyo) on the rear side of the substrate 1, and the substrate was subjected to reactive ion etching through the etching mask to form the supply port 3. The reactive ion etching was performed by Bosch process with an ICP etching apparatus model 8E (manufactured by Alcatel). After the formation of the supply port 3, the etching mask was removed with a stripping solution.

Figure 3G:
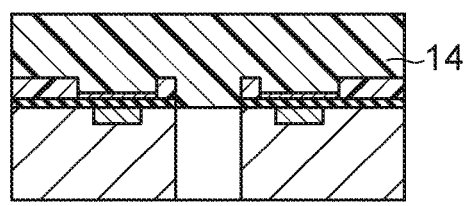

Then, a first photosensitive resin layer 14 was formed as shown in FIG. 3G. More specifically, first, a photosensitive resin composition shown in Table 2 was applied onto a 100 μm-thick PET film and heated at 90° C. for 5 minutes to remove the solvent. Thus, a 15 μm-thick film was formed on the PET film. The film of the photosensitive resin composition was transferred onto the substrate 1 including the energy generating elements 2 and having the intermediate layer 6 and the supply port 3 by lamination while being heated at 70° C.

TABLE 2

| | Product name | Parts by mass |
|---|---|---|
| Epoxy resin | EPICLON N-695 | 100 |
| | jER 1007 | 50 |
| Photo-acid generator | SP-172 | 3 |
| | CPI-410S | 1.5 |
| Acid generator | TPS-1000 | 0.5 |
| Silane coupling agent | A-187 | 5 |
| Solvent | PGMEA | 120 |

Figure 3H:
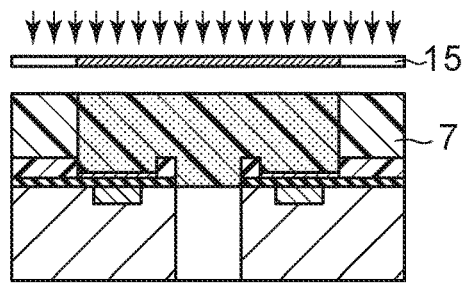

The first photosensitive resin layer 14 was then exposed to light at an exposure dose of 10000 J/m² with an i-line exposure stepper i5 (manufactured by Canon) through a flow channel-forming mask 15, as shown in FIG. 3H. The exposed portion was cured to form a flow channel member 7 by being heated at 50° C. for 5 minutes.

Figure 3I:
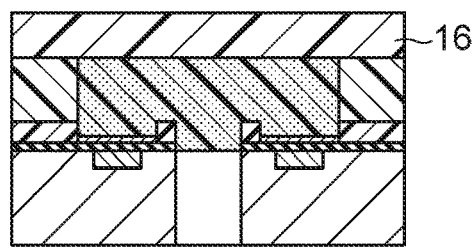

Then, a second photosensitive resin layer 16 was formed as shown in FIG. 3I. More specifically, first, a photosensitive resin composition shown in Table 3 was applied onto a 100 μm-thick PET film and heated at 90° C. for 5 minutes to remove the solvent. Thus, a 10 μm-thick film was formed on the PET film. The film of the photosensitive resin composition was transferred onto the first photosensitive resin layer 14 and the flow channel member 7 by lamination while being heated at 50° C.

TABLE 3

|  | Product name | Parts by mass |
| --- | --- | --- |
| Epoxy resin | 157S70 | 100 |
| Photo-acid generator | CPI-410S | 0.5 |
| Silane coupling agent | A-187 | 5 |
| Solvent | PGMEA | 140 |

Figure 3J:
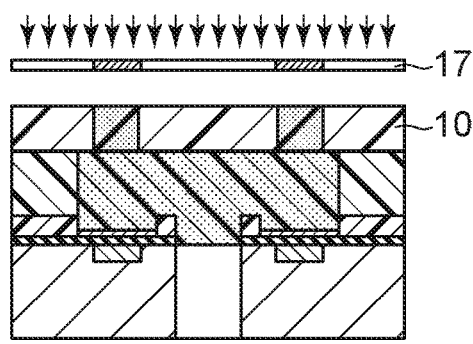

The second photosensitive resin layer 16 was then exposed to light at an exposure dose of 1100 J/m² with an i-line exposure stepper i5 (manufactured by Canon) through an ejection opening-forming mask 17, as shown in FIG. 3J. The exposed portion was cured to form an ejection opening member 10 by being heated at 90° C. for 5 minutes.

Figure 3K:
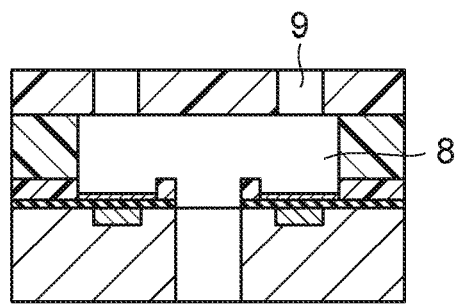

Then, as shown in FIG. 3K, the unexposed portions of the first and the second photosensitive resin layers 14 and 16 were simultaneously removed by development using PGMEA for 1 hour, thus forming the flow channels 8 and ejection openings 9. Finally, the resulting structure was heated at 200° C. to yield a liquid ejection head.

The water absorptions, before the removal with the developer, of the intermediate layer 6 and the exposed portions of the first photosensitive resin layer 14 and the second photosensitive resin layer 16 were determined according to the following procedure. First, each of the photosensitive resin compositions shown in Tables 1 to 3 was applied onto a silicon substrate and heated at 90° C. for 5 minutes to remove the solvent, thus forming a 5 µm-thick film on the substrate. The resulting film of the resin composition was cured through exposure and heating under the same conditions as in the above-described method. The substrate having the cured product of the resin composition was immersed in pure water of 70° C. for 24 hours. The change in mass of the resin composition was measured before and after the immersion with a mass measurement system Mentor OC23 (manufactured by Metryx). The changes in mass (water absorption) of the intermediate layer 6, the exposed portion of the first photosensitive resin layer 14, and the exposed portion of the second photosensitive resin layer 16 were 0.53%, 0.42%, and 0.16%, respectively.

Example 2

A liquid ejection head was prepared in the same manner as in Example 1 except that the intermediate layer 6 was formed to a thickness of 0.5 µm. The water absorption of the intermediate layer 6 measured in the same manner as in Example 1 was 0.51%.

Example 3

A liquid ejection head was prepared in the same manner as in Example 1 except that the intermediate layer 6 was formed to a thickness of 2.5 µm. The water absorption of the intermediate layer 6 measured in the same manner as in Example 1 was 0.54%.

Example 4

A liquid ejection head was prepared in the same manner as in Example 1, except that the first photosensitive resin layer 14 was formed of the photosensitive resin composition shown in Table 1 at an exposure dose of 8000 J/m² and that the exposure dose for the second photosensitive resin layer 16 was 500 J/m². The water absorptions of the exposed portion of the first photosensitive resin layer 14 and the exposed portion of the second photosensitive resin layer 16 measured in the same manner as in Example 1 were 0.53% and 0.20%, respectively.

Example 5

A liquid ejection head was prepared in the same manner as in Example 1 except that the intermediate layer 6 was formed of the photosensitive resin composition shown in Table 4. The water absorption of the intermediate layer 6 measured in the same manner as in Example 1 was 0.43%.

TABLE 4

|  | Product name | Parts by mass |
| --- | --- | --- |
| Epoxy resin | EHPE 3150 | 80 |
|  | EPOLEAD GT401 | 20 |
| Photo-acid generator | SP-172 | 1 |
| Silane coupling agent | A-187 | 5 |
| Solvent | PGMEA | 100 |

Example 6

A liquid ejection head was prepared in the same manner as in Example 1 except that the intermediate layer 6 was formed of the same photosensitive resin composition as used in Example 5 and that the first photosensitive resin composition 14 was formed at an exposure dose of 18000 J/m². The water absorption of the first photosensitive resin layer 14 measured in the same manner as in Example 1 was 0.22%.

Example 7

A liquid ejection head was prepared in the same manner as in Example 1 except that the first photosensitive resin composition 14 was formed at an exposure dose of 18000 J/m². The water absorption of the first photosensitive resin layer 14 measured in the same manner as in Example 1 was 0.22%.

Comparative Example 1

A liquid ejection head was prepared in the same manner as in Example 1 except that the intermediate layer 6 was formed of a resin composition HIMAL 1200 (polyether amide resin in a mixed solvent of N-methylpyrrolidone and butyl cellosolve acetate, produced by Hitachi Chemical). Since this resin composition of the intermediate layer 6 was thermoplastic, the patterning of the intermediate layer 6 was performed by dry etching. More specifically, HIMAL 1200 was applied onto the substrate 1 by spin coating, and the coating of the resin composition was heated at 100° C. for 30 minutes and further at 250° C. for 60 minutes to remove the solvent to yield a 1.0 µm-thick intermediate layer 6. Subsequently, a layer of a positive photosensitive resin OFPR (produced by Tokyo Ohka Kogyo) was formed on the intermediate layer 6, followed by patterning. The intermediate layer 6 was subjected to $O_2$ plasma ashing for patterning by using the patterned positive photosensitive resin layer as a mask, followed by removing the mask or positive photosensitive resin layer. The water absorption of the intermediate layer 6 measured in the same manner as in Example 1 was 0.07%.

Comparative Example 2

An intermediate layer 6 was formed in the same manner as in Comparative Example 1. Then, a first photosensitive resin layer 14 was formed of the photosensitive resin composition shown in Table 3 at an exposure dose of 5500 J/m², and a second photosensitive resin layer was formed of the photosensitive resin composition shown in Table 2 at an exposure dose of 5000 J/m². Other steps were performed in the same manner as in Example 1. A liquid ejection head was thus prepared. The water absorptions of the exposed portion of the first photosensitive resin layer 14 and the exposed portion of the second photosensitive resin layer 16 measured in the same manner as in Example 1 were 0.10% and 0.50%, respectively.

Comparative Example 3

An intermediate layer 6 was formed in the same manner as in Example 1. Then, a first photosensitive resin layer 14 was formed of the photosensitive resin composition shown in Table 3 at an exposure dose of 5500 J/m², and a second photosensitive resin layer was formed of the photosensitive resin composition shown in Table 2 at an exposure dose of 5000 J/m². Other steps were performed in the same manner as in Example 1. A liquid ejection head was thus prepared. The water absorptions of the exposed portion of the first photosensitive resin layer 14 and the exposed portion of the second photosensitive resin layer 16 were the same as those in Comparative Example 2.

Comparative Example 4

A liquid ejection head was prepared in the same manner as in Example 1, except that the first photosensitive resin layer 14 was formed of the photosensitive resin composition shown in Table 3 at an exposure dose of 2000 J/m² and that the exposure dose for the second photosensitive resin layer 16 was 500 J/m². The water absorptions of the first photosensitive resin layer 14 and the second photosensitive resin layer 16 measured in the same manner as in Example 1 were both 0.20%.

Examinations

The surface of each liquid ejection head was observed under a laser microscope VD-9710 (manufacture by Keyence) to check for solvent cracks. Also, each liquid ejection head was charged with an ink containing ethylene glycol, urea, isopropyl alcohol, N-methylpyrrolidone, black dye, and water with a proportion of 5:3:2:5:3:82 (mass basis), and ruled lines and dots were printed. Print quality was evaluated according to the following criteria, and the results are shown in Tables 5 and 6.
A: There was no irregularity.
B: Slight irregularity was observed but was acceptable in practice.
C: Unacceptable irregularity was observed.

There occurred no solvent cracks in the surface of any of the liquid ejection heads of Examples 1 to 7, and each head of the Examples produced satisfactory print quality. On the other hand, there occurred solvent cracks in the surfaces of the liquid ejection heads of Comparative Examples 1 to 4, and the print quality of these liquid ejection heads was inferior.

TABLE 6

|  |  | Comparative Example 1 | Comparative Example 2 | Comparative Example 3 | Comparative Example 4 |
|---|---|---|---|---|---|
| Intermediate layer | Thickness | 1.0 µm | 1.0 µm | 1.0 µm | 1.0 µm |
|  | Water absorption | 0.07% | 0.07% | 0.53% | 0.53% |
| Flow channel member | Thickness | 15 µm | 15 µm | 15 µm | 15 µm |
|  | Water absorption | 0.42% | 0.10% | 0.10% | 0.20% |
| Ejection opening member | Thickness | 10 µm | 10 µm | 10 µm | 10 µm |
|  | Water absorption | 0.16% | 0.50% | 0.50% | 0.20% |
| Solvent cracks |  | Observed | Observed | Observed | Observed |
| Print quality |  | C | C | C | C |

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-033912, filed Feb. 24, 2017, which is hereby incorporated by reference herein in its entirety.

What is claimed is:

1. A method for manufacturing a liquid ejection head including a substrate, a flow channel member overlying the substrate and defining a flow channel through which a liquid flows, an ejection opening member overlying the flow channel member and defining an ejection opening through which the liquid is ejected, and an intermediate layer between the substrate and the flow channel member, the method comprising:
forming the intermediate layer over the substrate;
forming a first photosensitive resin layer over the intermediate layer;
selectively exposing the first photosensitive resin layer to light, thereby curing the portion of the first photosensitive resin layer defining the flow channel member;
forming a second photosensitive resin layer over the first photosensitive resin layer;
selectively exposing the second photosensitive resin layer to light, thereby curing the portion of the second photosensitive resin layer defining the ejection opening member; and
removing the unexposed portions of the first and the second photosensitive resin layer at one time with a developer;
wherein before the removing with the developer, water absorption W of intermediate layer, water absorption W1 of the exposed portion of the first photosensitive

TABLE 5

|  |  | Example 1 | Example 2 | Example 3 | Example 4 | Example 5 | Example 6 | Example 7 |
|---|---|---|---|---|---|---|---|---|
| Intermediate layer | Thickness | 1.0 µm | 0.5 µm | 2.5 µm | 1.0 µm | 1.0 µm | 1.0 µm | 1.0 µm |
|  | Water absorption | 0.53% | 0.51% | 0.54% | 0.53% | 0.43% | 0.43% | 0.53% |
| Flow channel member | Thickness | 15 µm | 15 µm | 15 µm | 15 µm | 15 µm | 15 µm | 15 µm |
|  | Water absorption | 0.42% | 0.42% | 0.42% | 0.53% | 0.42% | 0.22% | 0.22% |
| Ejection opening member | Thickness | 10 µm | 10 µm | 10 µm | 10 µm | 10 µm | 10 µm | 10 µm |
|  | Water absorption | 0.16% | 0.16% | 0.16% | 0.20% | 0.16% | 0.16% | 0.16% |
| Solvent cracks |  | None | None | None | None | None | None | None |
| Print quality |  | A | A | A | B | A | B | B | resin layer, and water absorption $W2$ of the exposed portion of the second photosensitive resin layer satisfy the relationship: $W \geq W1 > W2$, wherein the first photosensitive resin layer and the second photosensitive resin layer are exposed to light having the same wavelength, and wherein the second photosensitive resin layer is more sensitive to the same wavelength than the first photosensitive resin layer.

2. The method according to claim 1, wherein the forming of the intermediate layer includes exposing a resin layer to light, thereby curing the portion of the resin layer defining the intermediate layer.

3. The method according to claim 2, wherein the resin layer contains an epoxy resin and a photo-acid generator.

4. The method according to claim 2, wherein the resin layer has a thickness that is smaller than the first photosensitive resin layer and is in the range of 0.5 μm to 5.0 μm.

5. The method according to claim 1, wherein the first photosensitive resin layer and the second photosensitive resin layer each contain an epoxy resin and a photo-acid generator.

* * * * *